(12) United States Patent
Hack et al.

(10) Patent No.: US 9,385,168 B2
(45) Date of Patent: Jul. 5, 2016

(54) HIGH RESOLUTION LOW POWER CONSUMPTION OLED DISPLAY WITH EXTENDED LIFETIME

(71) Applicant: Universal Display Corporation, Ewing, NJ (US)

(72) Inventors: Michael Hack, Princeton, NJ (US); Michael Stuart Weaver, Princeton, NJ (US); Xin Xu, West Windsor, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/744,581

(22) Filed: Jan. 18, 2013

(65) Prior Publication Data
US 2014/0203244 A1    Jul. 24, 2014

(51) Int. Cl.
*H01L 29/08* (2006.01)
*H01L 21/00* (2006.01)
*H01L 27/32* (2006.01)
*H01L 51/50* (2006.01)

(52) U.S. Cl.
CPC ........... *H01L 27/3213* (2013.01); *H01L 27/322* (2013.01); *H01L 51/50* (2013.01)

(58) Field of Classification Search
CPC ..... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50
USPC ............... 257/13, 79–103, 918, 40, 642–643, 257/759, E51.018–E51.022, E33.054, 257/E25.028, E25.032, E31.058, E31.063, 257/E31.115, E27.133–E27.139; 438/22–47, 69, 493, 503, 507, 956
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |

(Continued)

FOREIGN PATENT DOCUMENTS

| WO | 2008057394 | 5/2008 |
|---|---|---|
| WO | 2010011390 | 1/2010 |

OTHER PUBLICATIONS

Baldo et al.,"Highly efficient phosphorescent emission from organic electroluminescent devices", Nature, vol. 395, pp. 151-154, 1998.

(Continued)

*Primary Examiner* — Julio J Maldonado
*Assistant Examiner* — Moin Rahman
(74) *Attorney, Agent, or Firm* — Morris & Kamlay LLP

(57) ABSTRACT

Arrangements of pixel components that allow for full-color devices, while using emissive devices that emit at not more than two colors, and/or a limited number of color altering layers, are provided. Devices disclosed herein also may be achieved using simplified fabrication techniques compared to conventional side-by-side arrangements, because fewer masking steps may be required.

31 Claims, 12 Drawing Sheets

(56) References Cited

U.S. PATENT DOCUMENTS

| | | | |
|---|---|---|---|
| 6,091,195 A | 7/2000 | Forrest et al. | |
| 6,097,147 A | 8/2000 | Baldo et al. | |
| 6,280,559 B1 | 8/2001 | Terada et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,968,146 B2 | 6/2011 | Wagner et al. | |
| 8,502,445 B2 | 8/2013 | Levermore et al. | |
| 2003/0178936 A1 | 9/2003 | Park et al. | |
| 2003/0230980 A1 | 12/2003 | Forrest et al. | |
| 2004/0174116 A1 | 9/2004 | Lu et al. | |
| 2007/0205423 A1* | 9/2007 | Yamazaki et al. | 257/89 |
| 2007/0279372 A1 | 12/2007 | Brown Elliott et al. | |
| 2008/0198180 A1 | 8/2008 | Langendijk et al. | |
| 2009/0092325 A1 | 4/2009 | Brown Elliott et al. | |
| 2010/0090620 A1 | 4/2010 | Hack et al. | |
| 2010/0103187 A1 | 4/2010 | Linssen et al. | |
| 2010/0231484 A1* | 9/2010 | Cok et al. | 345/32 |
| 2010/0244069 A1 | 9/2010 | Weaver | |
| 2011/0062427 A1* | 3/2011 | Jeong et al. | 257/40 |
| 2011/0095276 A1 | 4/2011 | Imai et al. | |
| 2011/0096530 A1 | 4/2011 | Shimizu et al. | |
| 2011/0309389 A1* | 12/2011 | Yu et al. | 257/89 |
| 2012/0075278 A1 | 3/2012 | Hara et al. | |
| 2012/0287605 A1* | 11/2012 | Chen | H01L 27/322 362/97.1 |
| 2013/0082589 A1 | 4/2013 | So et al. | |
| 2013/0187132 A1 | 7/2013 | Ando et al. | |
| 2014/0084256 A1* | 3/2014 | Kim et al. | 257/40 |

OTHER PUBLICATIONS

Baldo et al.,"Very high-efficiency green organic light-emitting devices based on electrophosphorescence", Applied Physics Letter, vol. 75, No. 1, pp. 4-6, 1999.

* cited by examiner

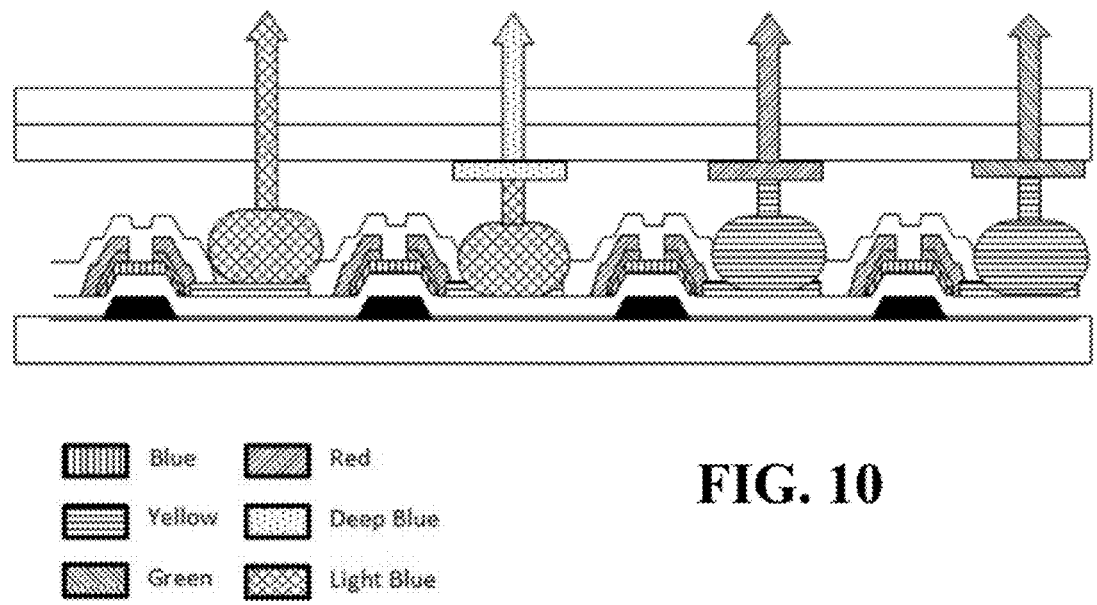
FIG. 10
FIG. 11
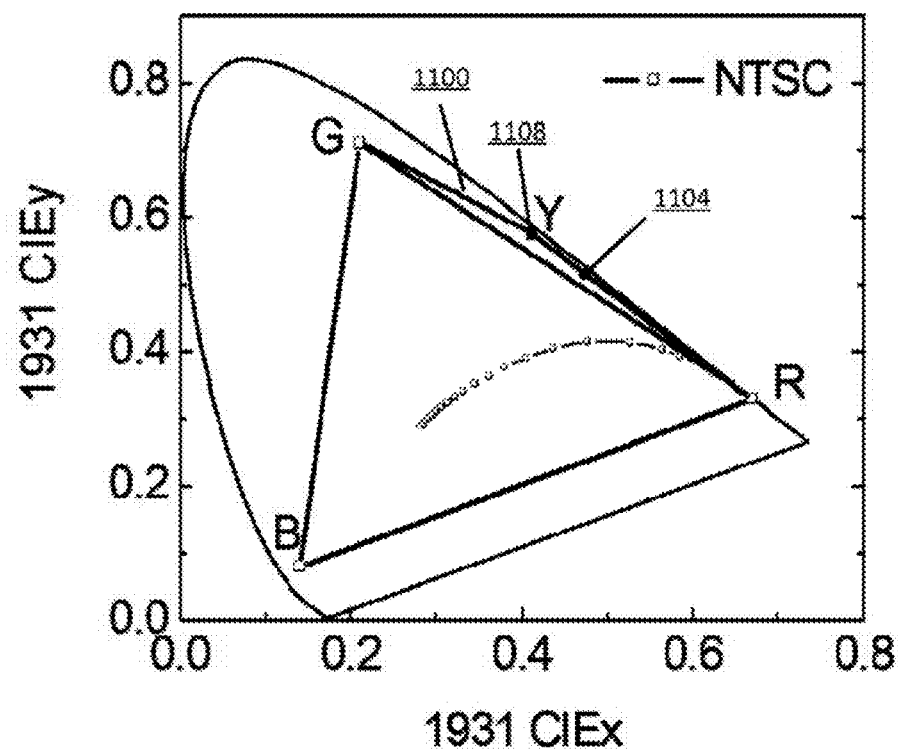

HIGH RESOLUTION LOW POWER CONSUMPTION OLED DISPLAY WITH EXTENDED LIFETIME

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices such as OLED devices and, more specifically, to devices that include full-color pixel arrangements that have sub-pixels that emit not more than two colors and/or incorporate not more than two color filters.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the following structure:

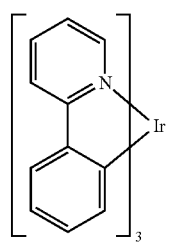

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between. As used herein, two layers or regions may be described as being disposed in a "stack" when at least a portion of one layer or region is disposed over at least a portion of the other.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, or device refers to one that emits light in the range of about 580-700 nm; a "green" layer, material, or device refers to one that has an emission spectrum with a peak wavelength in the range of about 500-600 nm; a "blue" layer, material, or device refers to one that has an emission spectrum with a peak wavelength in the range of about 400-500 nm. In some arrangements, separate regions, layers, materials, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy.

More details on OLEDs, and the definitions described above, can be found in U.S. Pat. No. 7,279,704, which is incorporated herein by reference in its entirety.

SUMMARY OF THE INVENTION

Pixel arrangements for light emitting devices are provided, which include sub-pixels that emit not more than two colors and/or not more than two color altering layers. Multiple sub-pixels within a full-color pixel arrangement may emit the same color light initially, which is then converted to one or more other colors by various color filter techniques.

According to an embodiment, a full-color pixel arrangement for an OLED device includes a plurality of sub-pixels, each of which includes an emissive region. The arrangement may include emissive regions that emit light of not more than two colors, and may include not more than two color altering layers. Each color altering layer may be disposed in a stack with an emissive region associated with a sub-pixel. The sub-pixels, and/or the corresponding emissive regions, may have different physical sizes, and each emissive region may include one or more emissive devices, layers, or materials.

In an embodiment, a full-color pixel for an OLED device may include a plurality of sub-pixels, including a first sub-pixel having an emissive region configured to emit blue light and a second sub-pixel having an emissive region configured to emit yellow light. The pixel arrangement may include emissive regions of not more than two colors, and/or not more than two color altering layers.

According to an embodiment, a full-color pixel arrangement for an OLED device may include first, second, and third sub-pixels. The first region may be configured to emit a first color, and the second and third regions each configured to emit a second color. A color altering layer may be disposed in a stack with the second and/or the third emissive region. The arrangement also may include a fourth sub-pixel having an emissive region configured to emit the second color. A third color altering layer, which may provide a color different than those disposed in a stack with the second and/or third emissive regions, also may be disposed in a stack with the fourth emissive region.

In an embodiment, a full-color OLED pixel arrangement may be fabricated by depositing a first emissive material through a mask over a substrate, and depositing a second emissive material through a mask over the substrate, where the second emissive material is configured to emit a different color than the first emissive material. A first color filter may be disposed in a stack with a portion of the second emissive material. In an embodiment, not more than two masking steps may be used to fabricate the arrangement.

BRIEF DESCRIPTION OF THE DRAWINGS

FIG. 10 shows a schematic illustration of a pixel arrangement according to an embodiment disclosed herein.

FIG. 11 shows the 1931 CIE diagram that highlights a set of points outside the RG line according to an embodiment disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
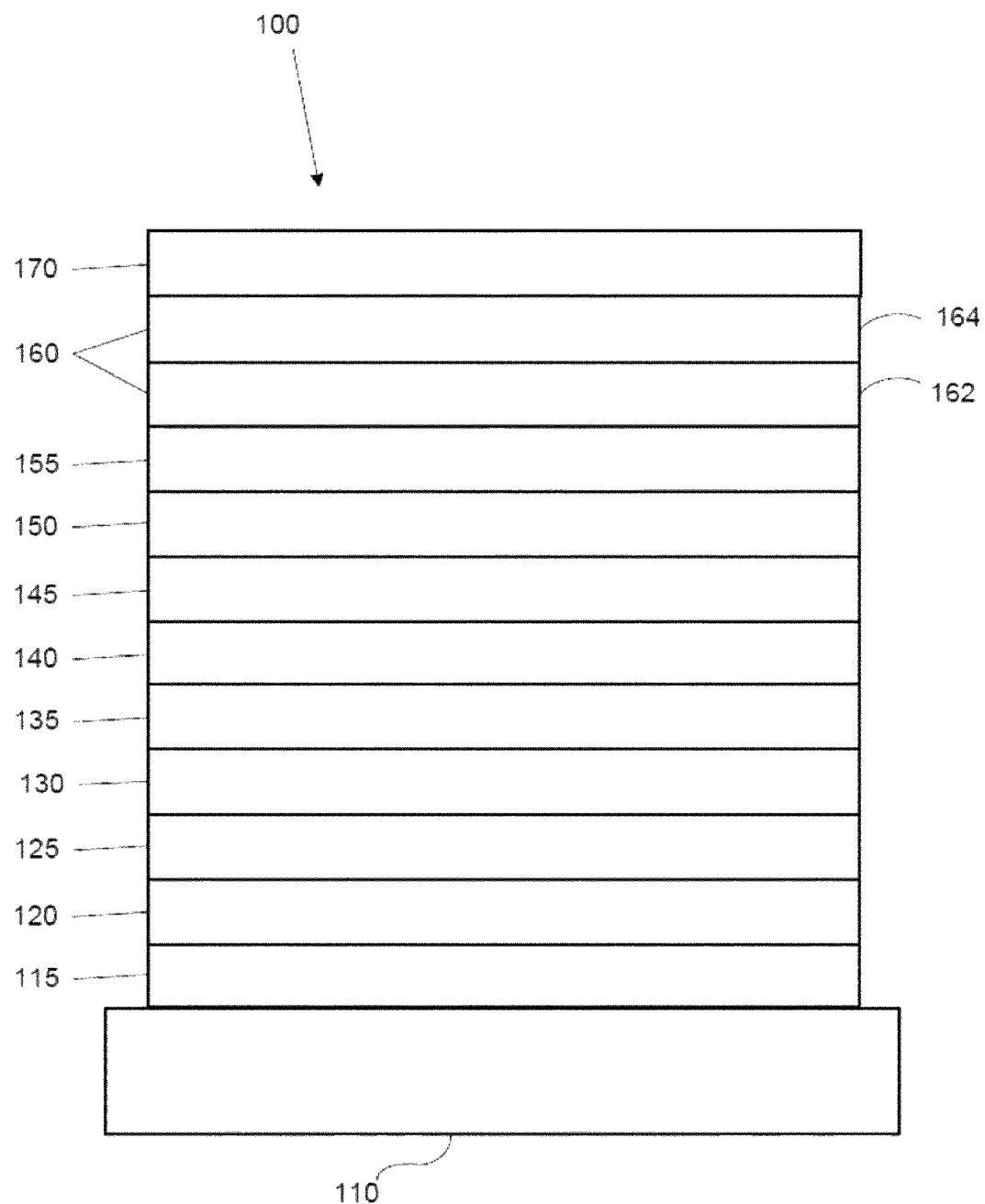
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
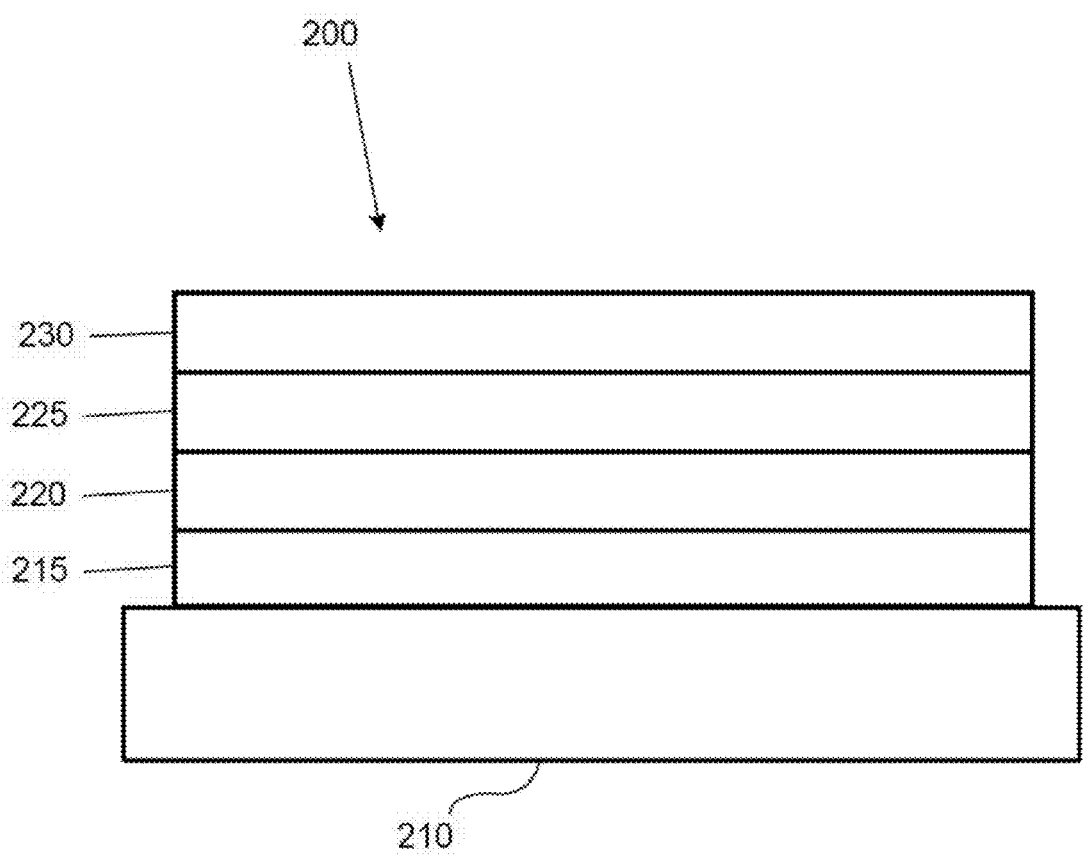
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, color tunable or color temperature tunable lighting sources, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are primarily intended for use in a temperature range comfortable to humans, such as 18 degrees C. to 30 degrees C., and more preferably at room temperature (20-25 degrees C.), but can operate at temperatures outside this range, such as −40° C. to +85° C. or higher.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylalkyl, heterocyclic group, aryl, aromatic group, and heteroaryl are known to the art, and are defined in U.S. Pat. No. 7,279,704 at cols. 31-32, which are incorporated herein by reference.

Current display architectures and manufacturing capabilities typically do not allow for low power consumption and high resolution OLED displays. For example, side by side (SBS) architecture typically can achieve relatively low power consumption (and therefore good lifetime), but this architecture may require relatively high resolution shadow masking. Such techniques often are limited to around 250 dpi resolution. To achieve higher resolutions, architectures using white devices in conjunction with color filters may be used to avoid patterning the OLED emissive layers. However, such techniques typically suffer from relatively lower efficiency and therefore higher power consumption, which also reduces lifetime. These constraints may be somewhat overcome by employing a RGBW pixel architecture that uses both an unfiltered white sub-pixel and devices that emit at individual colors by employing color filters over other white sub-pixels. This architecture generally is considered to result in poorer image quality, and typically still has a lower power consumption and poorer lifetime than a comparable RGB SBS display.

The present disclosure provides arrangements of pixel components that allow for full-color devices, while using emissive devices that emit not more than two colors, and/or a limited number of color altering layers. Embodiments disclosed herein may provide improved performance over conventional RGBW displays, such as lower power consumption and longer lifetime, with fewer high resolution masking steps, and at a lower resolution, in comparison to a conventional RGB SBS display That is, although an arrangement as disclosed herein may include any number of sub-pixels or other emissive devices or regions, within the arrangement there may be a limited number of colors emitted by emissive devices or regions within the arrangement. As a specific example, an arrangement as disclosed herein may include three sub-pixels. Two of the sub-pixels may include emissive regions, such as OLEDs, that emit light of the same color, with one of the sub-pixels being filtered or otherwise modified to produce a different color after light is emitted by the emissive region. The third sub-pixel may include an emissive region that emits light of a different color than the first emissive regions within the two sub-pixels. Thus, although the sub-pixels overall may produce light of three or more colors, the emissive regions within the arrangement need only initially emit light of two colors. Devices disclosed herein also may be achieved using simplified fabrication techniques compared to conventional SBS arrangements, because fewer masking steps may be required.

In an embodiment, two masking steps may be used. This may provide for simplified fabrication when compared to the three masking steps required for a conventional RGB SBS display. Each mask opening area may be approximately half the pixel area, as opposed to a third in a conventional SBS display. The increased area of the shadow mask opening relative to a conventional SBS display of the same pixel size may allow for higher pixel density. For example, the same size opening will allow for up to about a 50% increase in display resolution compared to a conventional SBS technique. In some configurations, the exact size of the mask openings may be determined based upon lifetime matching considerations, such as to optimize current flow through each sub-pixel and thus improve overall display lifetime.

An increase in fill factor also may also be possible using techniques disclosed herein, particularly for top emitting AMOLED displays, which may allow for higher efficiency relative to a conventional three-mask pixilation approach of the same resolution. This is due to the relatively increased area of the three sub-pixels in a two-mask approach as disclosed, compared to a conventional three-mask approach.

With a two-mask approach as disclosed, less current may be required for at least some sub-pixels, to render the same luminance from a display. This may result in higher device efficiency, lower voltage, and/or longer display lifetime.

Figure 3:
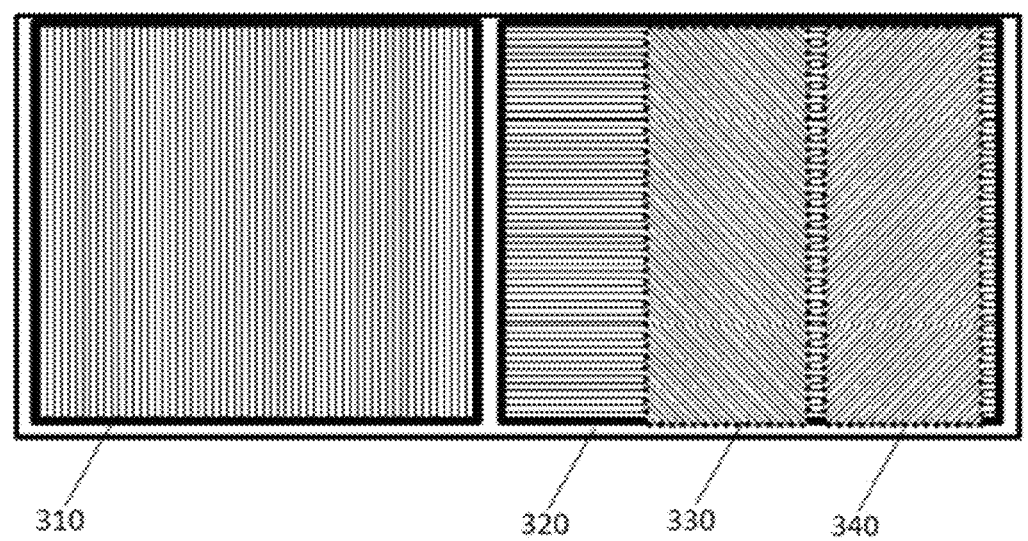
FIG. 3 shows a schematic illustration of an example masking arrangement suitable for fabricating a pixel arrangement as disclosed herein.
Figure 3:
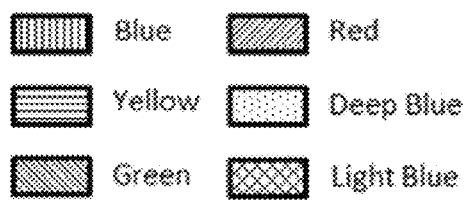

FIG. 3 shows a schematic illustration of an example masking arrangement suitable for fabricating a pixel arrangement as disclosed herein. In a first masked deposition, an emissive layer structure, or a stacked device structure including multiple emissive layers, may be deposited in a first region 310. The first region contains one or more emissive layers that emit light of a first color. A second masked deposition may be performed in an adjacent or otherwise nearby region 320, to deposit an emissive layer or stacked structure that emits light of a second color different from the first. Two color altering layers 330, 340, may then be disposed over the second emissive region, such that light passing through each filter may be converted from the second color to third and fourth colors, respectively, each different from the first and second. In some configurations, a portion of the second emissive region may be left uncovered, such that the illustrated arrangement may provide light having four distinct colors. In some configurations, the color altering layers 330, 340 may cover the entirety of the second region, such that the illustrated arrangement provides light of three distinct colors. Although shown as disposed with some distance between them in FIG. 3 for illustration purposes, it will be understood that in general the color filters may be disposed immediately adjacent to one another, such that no yellow light is emitted in the region between the filters. Similarly, each filter may extend to the appropriate edges of the yellow emissive region, such that no yellow light is emitted from the edge immediately adjacent to the color altering layer. Each of the emissive layers or stacked structures may include one or more emissive materials, each of which may be phosphorescent or fluorescent. More generally, each emissive material may include any of the emissive materials, layers, and/or structures disclosed herein.

As a specific example, the first mask deposition 310 may provide a blue device, which may be a single EML structure or a stacked device containing more than one EML. As is known in the art, a stacked device may be desirable to provide extended lifetime and/or reduced image sticking; in other arrangements, a single-layer emissive device may be preferred to reduce fabrication cost and complexity. The blue OLED may be phosphorescent or fluorescent. The second mask deposition 320 may provide a yellow device, which may be made, for example, by combining red and green emitters. More generally, the yellow device may be provided using any suitable combination of emissive materials and/or layers. As specific examples, separate red and green emitters may be provided in one mixed layer; in separate layers within a two-EML device; in a stacked device with a red EML in one OLED within the stack and a green EML in the other; in a yellow device using a single EML containing a yellow emitter; or in a stacked device containing two yellow EMLs. Thus, in some configurations, an emissive region may be provided by multiple emissive materials, each of which has an emission spectrum or peak emission wavelength that differs from the ultimate color of the region as a whole. Various combinations also may be used, though advantageously any selected combination may be deposited using the same second mask arrangement. In the completed example configuration, the blue device is controlled by one anode and associated active matrix control circuit. The yellow device is divided into three sub-pixels, yellow, green and red. Each sub-pixel is then controlled by its own anode and associated active matrix control circuit. The yellow sub-pixel uses the unfiltered yellow light from the yellow OLED. The green sub-pixel is obtained by placing a green color filter over the yellow OLED, and, similarly, a red sub-pixel is obtained by placing a red color filter over the yellow OLED. Thus, the resulting pixel arrangement has four sub-pixels, red, green, blue, and yellow (RGBY). Such an arrangement may be advantageous, because the blue performance may not be limited by a color filter as in a conventional RGBW display, but may have the same optimized lifetime as in a conventional RGB SBS display. Further, in a conventional RGBW arrangement, the green color filter is configured to prevent transmission of as much blue and red light as possible. Thus, a band-pass filter typically is used as the green color filter. In an RGBY arrangement as disclosed herein where yellow light is used as a multi-component light source, the green color filter may be configured to prevent transmission only of red light since the multi-component light does not include a blue component. Thus, a cut-off filter may be used instead of a band-pass filter, which may provide relatively greater efficiency and color saturation.

Embodiments disclosed herein may use unfiltered yellow light to improve display efficiency at times when highly saturated red or green is not required. In operation, the unfiltered yellow device may be used in a similar manner to white in conventional a RGBW display, and similar algorithms may be employed for signal processing. To render a specific unsaturated color, yellow light can be mixed with the three individual primary red, green or blue colors, which may provide higher efficiency than just using the red, green or blue primary colors alone. A full-color display using this technique may have only about a 12% higher power consumption than a conventional SBS RGB arrangement, in contrast to a conventional RGBW arrangement which typically has about a 50% higher power consumption than the SBS RGB arrangement. This level of power reduction may be achieved even if the overall red and green sub-pixel efficiency is reduced by 25%. For example, color filters may reduce the efficiency for the red and green alone by 50%, but the unfiltered yellow sub-pixel may restore much of this loss.

Embodiments disclosed herein similarly may allow for increased display color range. For example, referring to FIG. 11, a yellow multi-component source may be configured such that it emits light having CIE coordinates that lie on the "RG line" between the identified pure red and green points, such as the illustrated point 1104. In some embodiments, the identified red and green points may correspond to the "pure" colors emitted by emissive regions in the corresponding sub-pixels. Alternatively, the yellow multi-component source may be configured to emit light that lies outside the RG line, such as point 1108, any point along the illustrated curve 1100, or the like. The use of such a multi-component source may increase the available display color gamut, by allowing for use of the CIE region outside the RG line. The increase in color gamut may be achieved or used when the yellow multi-component source is filtered to provide red and/or green light, or it may be used when the yellow source is used unfiltered, according to the various arrangements disclosed herein. Thus, in some configurations, it may be desirable for the yellow multi-component source to have CIE coordinates that lie outside the RG line on the 1931 CIE diagram.

Figure 4:
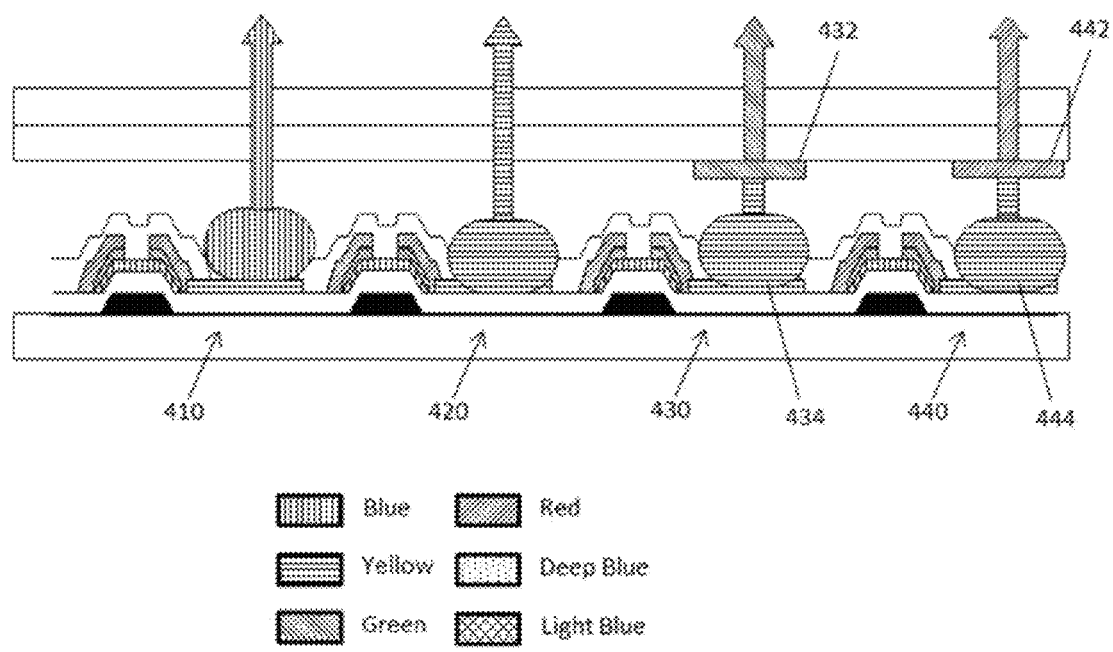
FIG. 4 shows a schematic illustration of a pixel arrangement according to an embodiment disclosed herein.

FIG. 4 shows a schematic illustration of a pixel arrangement according to an embodiment disclosed herein. As described with respect to FIG. 3, the arrangement includes four sub-pixels 410, 420, 430, 440. One sub-pixel 410 includes one or more emissive devices or regions that emit light of a first color. The other sub-pixels 420, 430, 440 are constructed using emissive regions that emit light of a second color. A color altering layer 432, 442 may be disposed over each of two of the emissive regions 434, 444. The third sub-pixel 420 is left unfiltered, resulting in a pixel arrangement that has four sub-pixels, each providing light of a different color. As described with respect to FIG. 3, each sub-pixel may be controlled by an associated control circuit. Example control circuits are shown in FIG. 4 for purposes of illustration, with various control elements shaded to match the controlled emissive regions. The specific arrangement of control circuitry is provided by way of example only, and any suitable control circuitry may be used as will be readily apparent to one of skill in the art.

In general parlance in the art, a "sub-pixel" may refer to the emissive region, which may be a single-layer EML, a stacked device, or the like, in conjunction with any color altering layer that is used to modify the color emitted by the emissive region. For example, the sub-pixel 430 includes an emissive region 434 and a color altering layer 432. As used herein, the "emissive region" of a sub-pixel refers to any and all emissive layers, regions, and devices that are used initially to generate light for the sub-pixel. A sub-pixel also may include additional layers disposed in a stack with the emissive region that affect the color ultimately produced by the sub-pixel, such as color altering layers disclosed herein, though such color altering layers typically are not considered "emissive layers" as disclosed herein. An unfiltered sub-pixel is one that excludes a color modifying component such as a color altering layer, but may include one or more emissive regions, layers, or devices.

Figure 5:
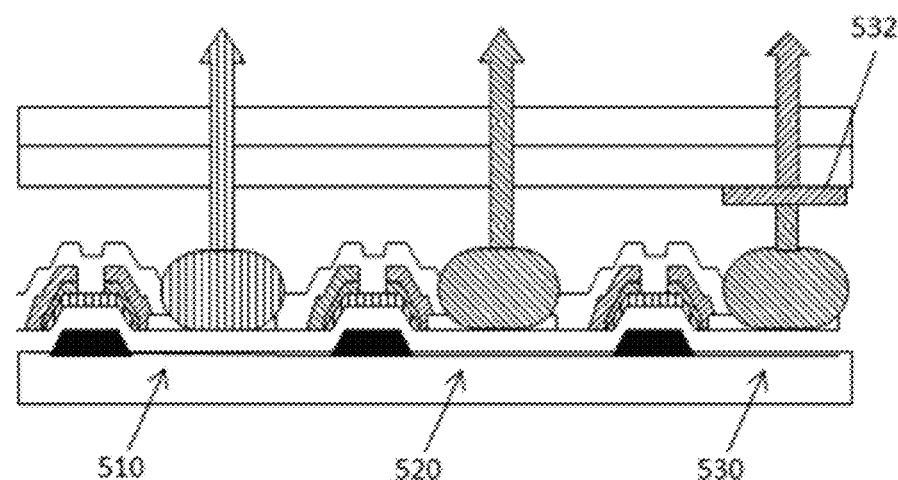
FIG. 5 shows a schematic illustration of a pixel arrangement according to an embodiment disclosed herein.

In some configurations, fewer sub-pixels may be used to achieve a full-color device or pixel arrangement. FIG. 5 shows an example arrangement that uses three sub-pixels 510, 520, 530. Similarly to the example shown in FIG. 4, a first sub-pixel 510 may be created by depositing one or more emissive regions through a mask, in a single emissive layer or a stacked arrangement, and leaving the resulting sub-pixel unfiltered. The other two sub-pixels 520, 530, may be deposited during a single masked deposition. As previously described, each may include one or more emissive materials and/or layers, and may be individual emissive layers or stacked devices. A color altering layer 532 may then be disposed over one or more of the emissive regions, to result in a full-color arrangement having three sub-pixels of different colors.

As a specific example, the two masking steps may be blue and green. That is, in a first masked deposition technique, a blue layer or stack may be deposited in a region corresponding to the first sub-pixel 510. Green layers or stacked devices may be deposited in regions corresponding to the second and third sub-pixels 520, 530 in a second masked deposition. The green sub-pixel 520 provides unfiltered green light. The red sub-pixel 530 uses a color altering layer 532, such as a green-to-red color changing layer having a relatively high conversion efficiency, to convert the green light emitted by the green device 530 to red light. Such a configuration may result in a display that with up to 50% higher resolution than a comparable conventional RGB SBS display, with little or no increase in power consumption or associated decrease in lifetime Such an approach also may improve the display efficiency by not "losing" as much light due to use of a conventional color filter, instead using a color changing layer to provide the third color.

Figure 6:
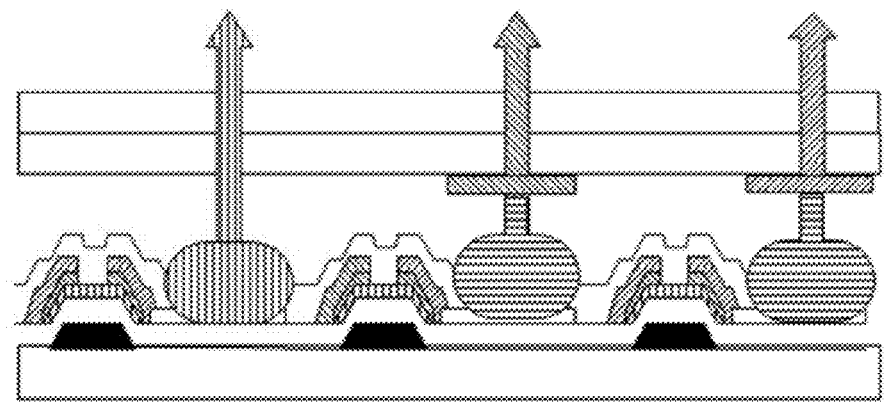
FIG. 6 shows a schematic illustration of a pixel arrangement according to an embodiment disclosed herein.
Figure 6:
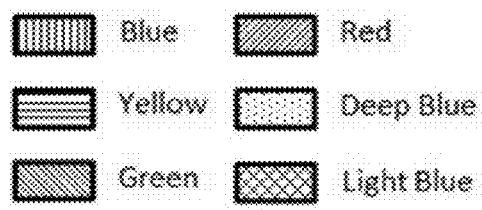

FIG. 6 shows a schematic illustration of a configuration in which the two masking steps are blue and yellow, i.e., one or more blue emissive layers are deposited during one masked deposition, and one or more yellow emissive layers are deposited during another. As with FIG. 6, the illustrated configuration uses only three sub-pixels, red, green, and blue. In this example, the green sub-pixel uses a green color filter to convert light from the yellow OLED to green, the red sub-pixel uses a red color filter to convert light from the yellow OLED to red, and the blue sub-pixel uses unfiltered light from the blue OLED. Similar configurations may use color altering layers other than or in addition to the specific color filters shown.

In some configurations, the efficiency of one or more sub-pixels may be enhanced by using a color changing layer instead of, or in addition to, a conventional color filter. For example, referring to the example shown in FIG. 6, a red color changing layer with a relatively high conversion efficiency from yellow to red may be placed between the yellow OLED and red color filter. Such a configuration may enhance the red sub-pixel efficiency. More generally, the use of a color changing layer disposed in a stack with an OLED, or an OLED and a color filter, may enhance the efficiency of that sub-pixel.

Figure 7:
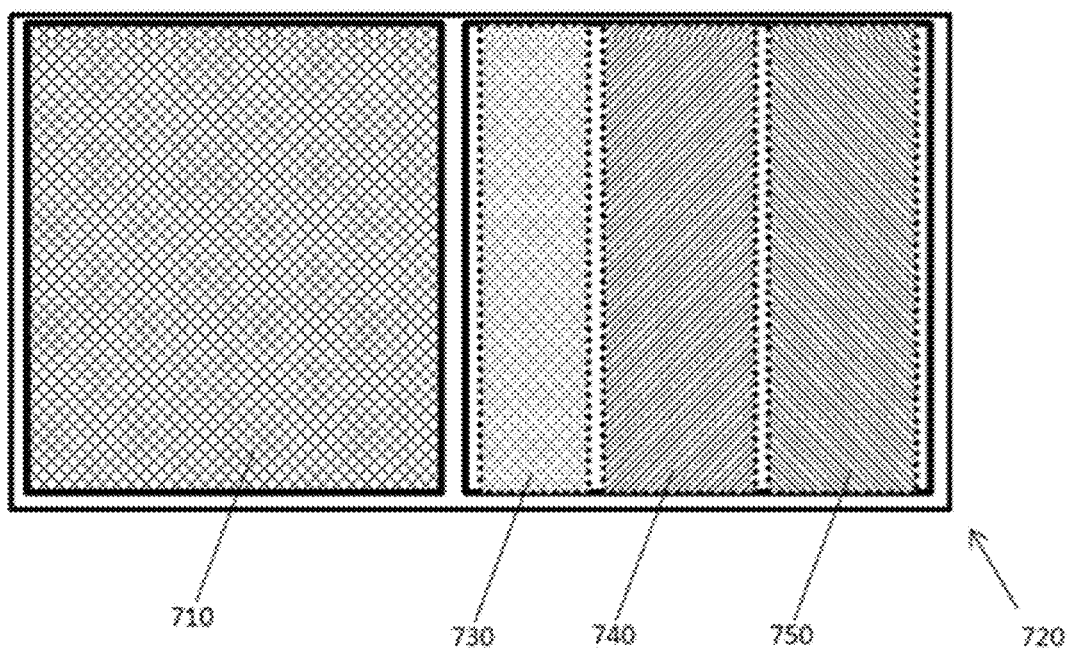
FIG. 7 shows a schematic illustration of an example masking arrangement suitable for fabricating a pixel arrangement as disclosed herein.
Figure 7:
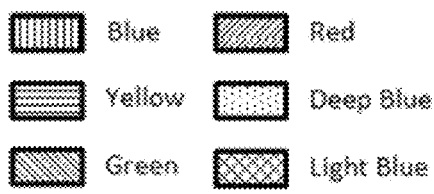

Other configurations disclosed herein may use additional color altering layers, and may include color altering layers disposed over multiple emissive regions or types of emissive region. FIG. 7 shows an example masking arrangement that uses emissive regions of two colors, light blue 710 and white 720. The masked areas may be used to deposit emissive regions of each color as previously disclosed. Various color altering layers also may be disposed over the resulting emissive regions to create a full-color pixel arrangement. In the example shown in FIG. 7, a deep blue color filter 730, a red color filter 740, and a green color filter 750 are disposed over corresponding white emissive regions, to form three sub-pixels of those colors, while the light blue emissive region remains unfiltered to form a light blue sub-pixel. Such a configuration may be used to enhance overall blue lifetime by using the light blue and deep blue sub-pixels as needed, as described in U.S. Patent Publication No. 2010/0090620, the disclosure of which is incorporated by reference in its entirety. As previously described, other color altering layers may be used in addition to or instead of the specific color filters described with respect to FIG. 7.

Figure 8:
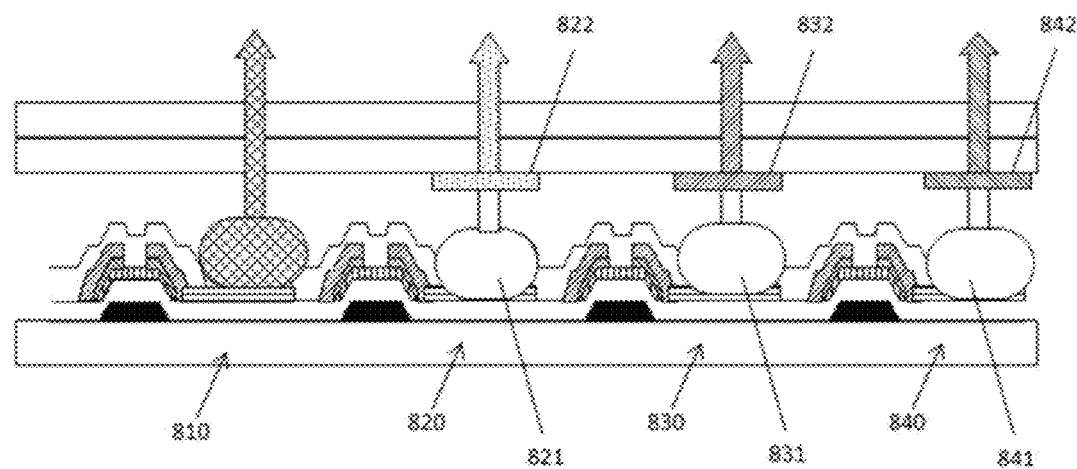
FIG. 8 shows a schematic illustration of a pixel arrangement according to an embodiment disclosed herein.
Figure 8:

FIG. 8 shows an example pixel arrangement corresponding to the deposition arrangement shown in FIG. 7. Similarly to the arrangement shown in FIG. 4, the arrangement of FIG. 7 includes an unfiltered sub-pixel 810, and three sub-pixels 820, 830, 840 each of which is formed from an emissive region 821, 831, 841 and a color filter 822, 832, 842, respectively. In the example shown in FIG. 7, the unfiltered sub-pixel 810 is a light blue sub-pixel, and the color filters 822, 832, 842 are deep blue, red, and green, respectively. The specific emission colors and color filters shown are illustrative only, and various other colors, color altering layers, and combinations may be used without departing from the scope of embodiments disclosed herein.

Figure 9:
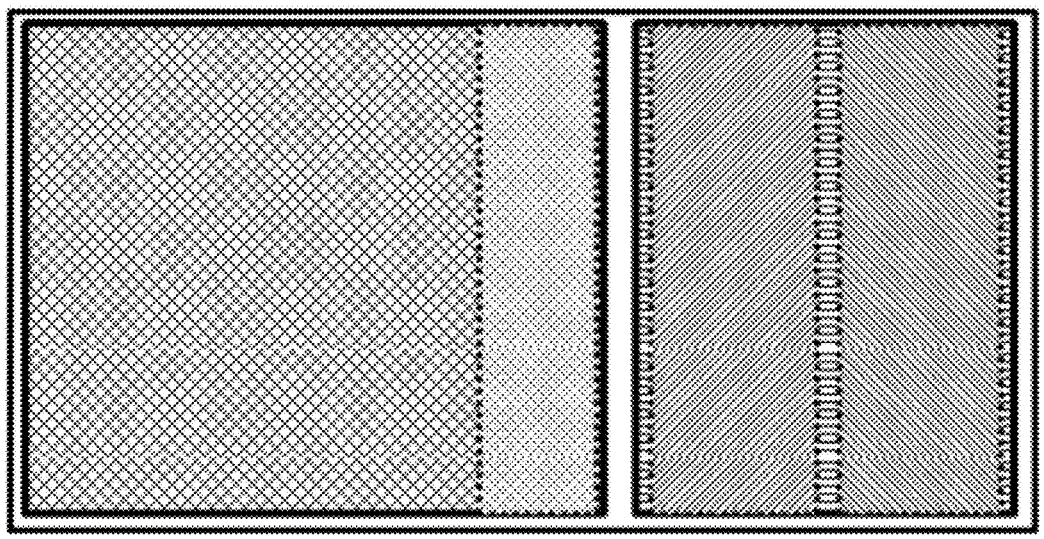
FIG. 9 shows a schematic illustration of an example masking arrangement suitable for fabricating a pixel arrangement as disclosed herein.
Figure 9:
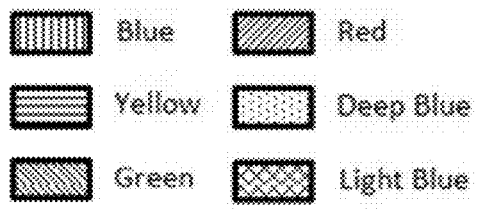

In an embodiment, each emissive region deposited during each of two masked deposition operations may be combined with a color altering layer to form one or more pixels. FIG. 9 shows an example arrangement in which each type of emissive region is combined with one or more color altering layers to create multiple sub-pixels. For example, the two masked regions may correspond to a light blue emissive region 910 and a yellow emissive region 920, each of which may be deposited in one of two masking steps as previously described. A deep blue color altering layer 930 may be combined with a light blue emissive region 910 to form a deep blue sub-pixel. Red and green color altering layers 930, 940, respectively, each may be combined with a portion of a yellow emissive region to form red and green sub-pixels. A light blue emissive region also may be left unfiltered to form a light blue sub-pixel. As described with respect to FIG. 7, use of the light and deep blue sub-pixels may improve performance and device lifetime. In addition, the relatively long light blue lifetime can extend overall display operation and provide improved power efficiency, since the light blue sub-pixel is unfiltered.

FIG. 10 shows a pixel arrangement corresponding to the mask and color altering layer arrangement described with respect to FIG. 9. As shown, four sub-pixels are created from two emissive regions of a first color, one of which is unfiltered, and two emissive regions of a second color. Following the example of FIG. 9, a light blue sub-pixel is formed from an unfiltered light blue emissive region, a deep blue sub-pixel is formed from a light blue emissive region and a deep blue color altering layer, a red sub-pixel is formed from a yellow emissive region and a red color altering layer, and a green sub-pixel is formed from a yellow emissive region and a green color altering layer. The specific emission colors and color altering layers shown are illustrative only, and various other colors, color altering layers, and combinations may be used without departing from the scope of embodiments disclosed herein.

Figure 12:
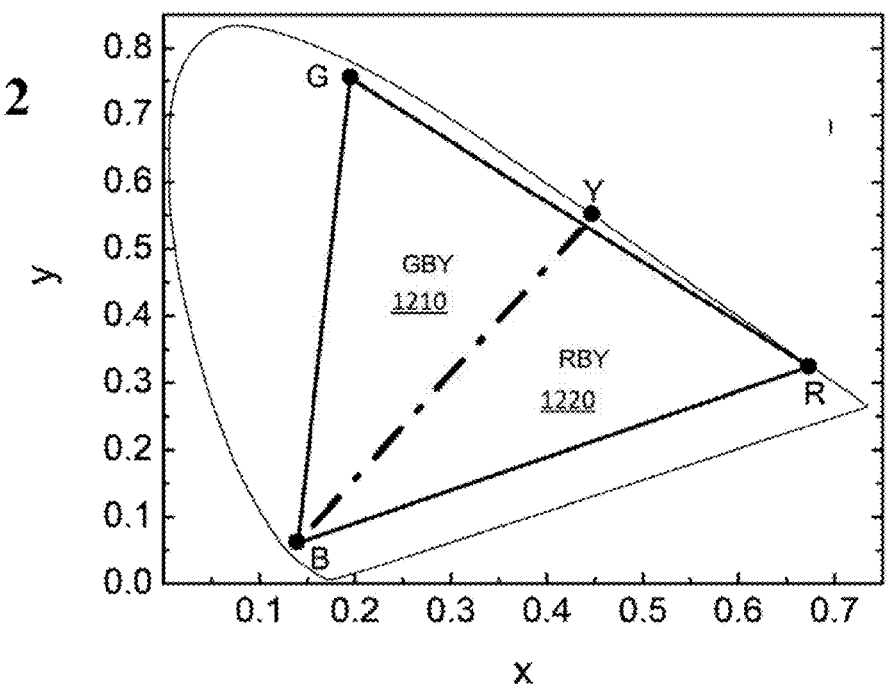
FIG. 12 shows the 1931 CIE diagram with coordinates for pure red, green, and blue, and for a multi-component yellow source that lies outside the RG line according to an embodiment disclosed herein.
Figure 13:
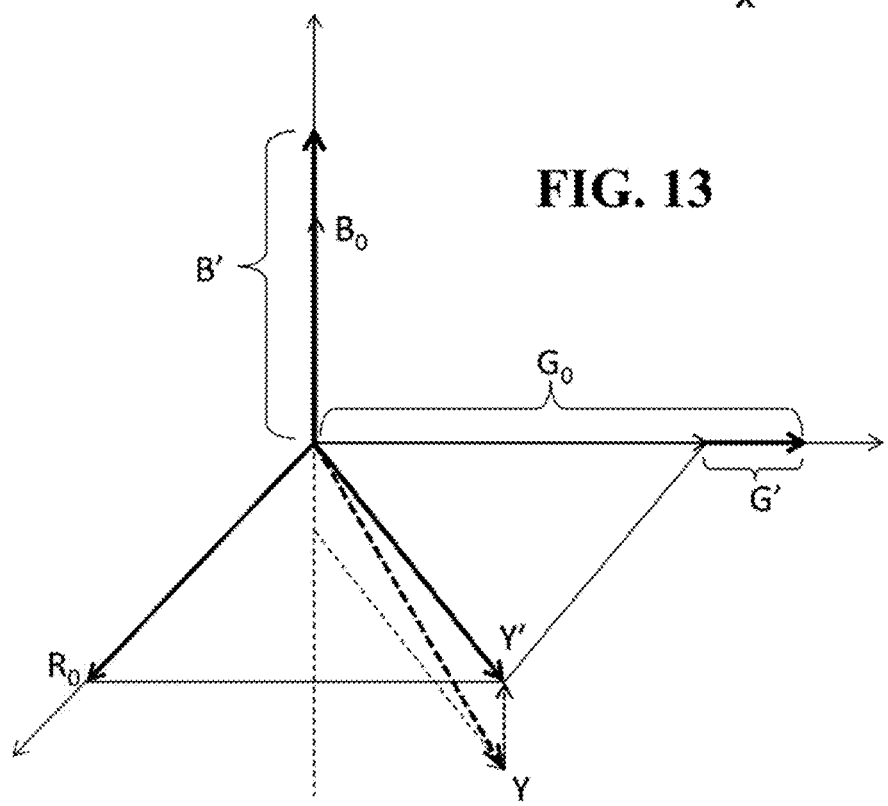
FIG. 13 illustrates an example color point rendered without the use of a red sub-pixel according to an embodiment disclosed herein.

Embodiments of the invention disclosed herein may use a variety of drive schemes. In many embodiments, four sub-pixels may be available to render each color. Typically, only three sub-pixels may be needed to render a particular color; thus there are multiple options available for the electrical drive configuration used to render the color. For example, FIG. 12 shows the 1931 CIE diagram with coordinates for pure red, green, and blue, and for a multi-component yellow source that lies outside the RG line according to an embodiment disclosed herein. In a four sub-pixel arrangement as disclosed herein, when rendering a color in the GBY space 1210, the red sub-pixel is not required; similarly, if the color to be rendered is within the RBY space 1220, the green sub-pixel is not required. FIG. 13 illustrates an example color point rendered without the use of a red sub-pixel, i.e., a point which lies within the GBY space 1210 in FIG. 12. As shown the initial contribution of pixels for the example point may be $R_0$, $G_0$, $B_0$ for the red, green, and blue sub-pixels, respectively, in a RGBW arrangement. In an RGBY arrangement as disclosed herein, the equivalent contributions for yellow, green, and blue sub-pixels may be Y', G', B', respectively. Notably, the red sub-pixel need not be used to render the desired color.

Figure 14:
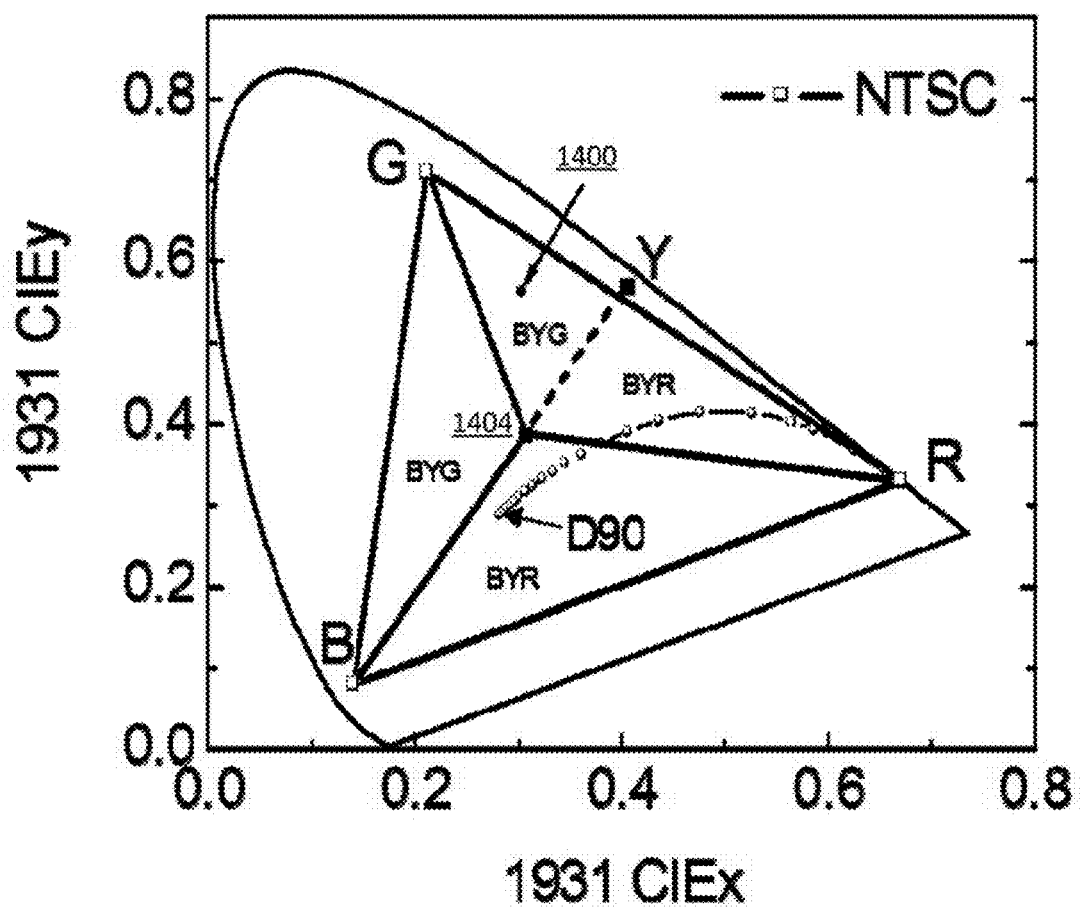
FIG. 14 shows a CIE diagram that identifies red, green, blue, and yellow points, an established white point, and various color regions according to an embodiment disclosed herein.

Another drive arrangement according to embodiments disclosed herein is to fix a white point using yellow and blue sub-pixels. A desired color may then be rendered through use of the green or red sub-pixel, depending on whether the color lies within the GBY or RBY space. FIG. 14 shows a CIE diagram that identifies red, green, blue, and yellow points as previously disclosed. A white point 1404 may be established along the BY line using a combination of only the blue and yellow sub-pixels, as shown. A color point 1400 falling in the GBY space, i.e., on the green side of the BY line, thus may be rendered by using the green sub-pixel in addition to the blue and yellow sub-pixels. Similarly, a point in the BYR space, i.e., on the red side of the BY line, may be rendered using the blue, yellow, and red sub-pixels. Thus, embodiments disclosed herein allow for a variety of drive arrangements, and may provide additional flexibility, efficiency, and color range compared to conventional RGBW and similar arrangements.

In general, each emissive region, layer, or device disclosed herein may be a single-layer emissive layer, or it may be a stacked device. Each emissive region, layer, or device may also include multiple emissive materials which, when operated in conjunction, provide the appropriate color light for the component. For example, a yellow emissive region may include both red and green emissive materials in an appropriate proportion to provide yellow light. Similarly, any emissive region or device may be a stacked device or otherwise include emissive sub-regions of sub-colors that are used to provide the desired color for the region or device, such as where a stacked configuration with red and green devices is used to provide a yellow emissive region. Each also may include multiple emissive materials that provide light of the same color or in the same region. Further, each emissive material used in any of the configurations disclosed herein may be phosphorescent, fluorescent, or hybrid, unless indicated specifically to the contrary.

The efficiency of devices or regions disclosed herein may be enhanced by the use of cavity optics. For example, the anode or a layer beneath the anode may be used to increase the optical length of an OLED in each sub-pixel. Such a configuration may be useful, for example, to increase the efficiency of red and green sub-pixels that may utilize light emitted by a common yellow OLED. The optical cavity length may be adjusted independently for each sub-pixels in a pixel arrangement, such as via lithography of the backplane, without the need for further masking of the organic layers. This may enhance the device efficiency of the sub-pixels, and consequently increase lifetime and reduce the drive voltage for the arrangement.

As used herein, various components may be used as color altering layers as disclosed. Suitable components include color conversion layers, color filters, color changing layers, and the like. The dyes used in color conversion layers as disclosed herein are not particularly limited, and any compounds may be used as long as the compound is capable of converting color of light emitted from a light source to a required color, which is basically a wavelength conversion element capable of converting the wavelength of the light from the light source to a wavelength 10 nm or more longer than that of the light of the light source. It may be an organic fluorescent substance, an inorganic fluorescent substance, or a phosphorescent substance, and may be selected according to the objective wavelength. Examples of the material include, but not limit to the following classes: xanthen, acridine, oxazine, polyene, cyanine, oxonol, benzimidazol, indolenine, azamethine, styryl, thiazole, coumarin, anthraquinone, napthalimide, aza[18]annulene, porphin, squaraine, fluorescent protein, 8-hydroxyquinoline derivative, polymethin, nanocrystal, protein, perylene, phthalocyanine and metal-ligand coordination complex.

Examples of the fluorescent dye for converting luminescence of from UV and higher energy light to blue light include, but not limit to the styryl-based dyes such as 1,4-bis (2-methylstyryl)benzene, and trans-4,4'-diphenylstilbene, and coumarin based dyes such as 7-hydroxy-4-methylcoumarin, and combinations thereof.

Examples of the fluorescent dye for converting luminescence of from blue light to green light include, but not limit to the coumarin dyes such as 2,3,5,6-1H,4H-tetrahydro-8-trifluoromethylquinolizino(9,9a,1-gh) coumarin, 3-(2'-benzothiazolyl)-7-diethylaminocoumarin, 3-(2'-benzimidazolyl)-7-N,N-diethylaminocoumarin, and naphthalimide dyes such as Basic Yellow 51, Solvent yellow 11 and Solvent Yellow 116, and pyrene dyes such as 8-Hydroxy-1,3,6-pyrenetrisulfonic acid trisodium salt (HPTS), and combinations thereof.

Examples of the fluorescent dye for converting luminescence of from blue to green light to red include, but not limit to the perylene based dyes such as N,N-bis(2,6-diisopropylphenyl)-1,6,7,12-tetraphenoxyperylene-3,4:9,10-tetracarboxdiimide (Lumogen Red F300), cyanine-based dyes such as 4-dicyanomethylene-2-methyl-6-(p-dimethylaminostyryl-4H-pyran, pyridine-based dyes such as 1-ethyl-2-(4-(p-dimethylaminophenyl)-1,3-butadienyl)-pyridinium perchlorate, and rhodamine-based dyes such as Rhodamine Band Rhodamine 6G, and oxazine-based dyes, and combinations thereof.

Examples of the inorganic fluorescent substance include, but not limit to an inorganic fluorescent substance comprising a metal oxide or metal chalcogenide doped with a transition metal ion, including a rare-earth metal ion.

Many metal-ligand coordination complexes can be used as dyes, they can be both fluorescent and phosphorescent substance.

It may be preferred to use a color conversion layer in the state that the layer is stacked on a color filter. The stacked structure thereof on the color filter makes it possible to make better color purity of light transmitted through the color conversion layer. In some configurations, a "color altering layer" as disclosed herein may include multiple components, such as a color filter disposed in a stack with a color conversion layer, or just a color conversion layer alone, or just a color filter alone.

The material used for color filters is not particularly limited. A filter may be made of, for example, a dye, a pigment and a resin, or only a dye or pigment. The color filter made of a dye, a pigment and a resin may be a color filter in the form of a solid wherein the dye and the pigment are dissolved or dispersed in the binder resin.

Examples of the dye or pigment used in the color filter include, but not limit to perylene, isoindoline, cyanine, azo, oxazine, phthalocyanine, quinacridone, anthraquinone, and diketopyrrolo-pyrrole, and combinations thereof.

As used herein, and as would be understood by one of skill in the art, a "color conversion layer" (e.g. a "down conversion layer") may comprise a film of fluorescent or phosphorescent material which efficiently absorbs higher energy photons (e.g. blue light and/or yellow light) and reemits photons at lower energy (e.g. at green and/or red light) depending on the materials used. That is, the color conversion layer may absorb light emitted by an organic light emitting device (e.g. a white OLED) and reemit the light (or segments of the wavelengths of the emission spectrum of the light) at a longer wavelength. A color conversion layer may be a layer formed by mixing the fluorescent medium material contained in the above-mentioned color conversion layer with the color filter material. This makes it possible to give the color conversion layer a function of converting light emitted from an emitting device and further a color filter function of improving color purity. Thus, the structure thereof is relatively simple.

Embodiments disclosed herein may be incorporated into a wide variety of products and devices, such as flat panel displays, smartphones, transparent displays, flexible displays, televisions, portable devices such as laptops and pad computers or displays, multimedia devices, and general illumination devices. Displays as disclosed herein also may have relatively high resolutions, including 250 dpi, 300 dpi, 350 dpi, or more.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A full-color pixel arrangement for an OLED device comprising:
    at least four sub-pixels, each sub-pixel of the at least four sub-pixels configured to emit light having a different peak wavelength than each other pixel of the at least four sub-pixels, and each sub-pixel comprising an emissive region;
    wherein the at least four sub-pixels comprise emissive regions of not more than two colors, and the pixel arrangement comprises not more than two color altering layers.

2. The pixel arrangement of claim 1, said plurality of sub-pixels further comprising:
    a first sub-pixel comprising a first emissive region configured to emit a first color; and
    a second sub-pixel comprising:
        a second emissive region configured to emit a second color; and
        a first color altering layer disposed in a stack with the second emissive region.

3. The arrangement of claim 2, further comprising:
    a third sub-pixel comprising a third emissive region configured to emit the second color.

4. The arrangement of claim 3, wherein the third sub-pixel further comprises:
    a second color altering layer disposed in a stack with the third emissive region.

5. The arrangement of claim 3, wherein the first sub-pixel has an area not less than the combined area of the second sub-pixel and the third sub-pixel.

6. The arrangement of claim 2, wherein the second sub-pixel has a larger area than the first sub-pixel.

7. The arrangement of claim 2, wherein the first emissive region comprises a stacked emissive device.

8. The arrangement of claim 2, wherein the second emissive region comprises a stacked emissive device.

9. The arrangement of claim 2, wherein the second emissive region comprises:
    a first emissive material having an emission spectrum of a third color; and
    a second emissive material having an emission spectrum of a fourth color;
    wherein each of the third and fourth colors are different from each of the first and second colors.

10. The arrangement of claim 1, wherein the first sub-pixel comprises a phosphorescent emissive material.

11. The arrangement of claim 1, wherein the first sub-pixel comprises a fluorescent emissive material.

12. The arrangement of claim 1, wherein the first color altering layer comprises a color conversion layer.

13. The arrangement of claim 1, wherein the first color altering layer comprises a color filter.

14. The arrangement of claim 1, further comprising a downconversion filter disposed in a stack with the second sub-pixel.

15. The arrangement of claim 1, wherein the first color altering layer comprises a band-pass filter.

16. The arrangement of claim 1, wherein the first color altering layer comprises a cut-off filter.

17. An OLED device comprising the pixel arrangement of claim 1.

18. A device as recited in claim 17, wherein the device is a type selected from the group consisting of: a flat panel display, a smartphone, a transparent display, a flexible display, a television, a portable device, a multimedia device, and an illumination device.

19. A device as recited in claim 17, wherein the OLED device is a display having a resolution of at least 250 dpi.

20. The arrangement of claim 1, further comprising a plastic substrate.

21. An active matrix OLED device comprising the pixel arrangement as recited in claim 1.

22. A flexible OLED device comprising the pixel arrangement as recited in claim 1.

23. A full-color pixel arrangement for an OLED device comprising:
    a first sub-pixel comprising a first emissive region, the first emissive region configured to emit blue light;
    a second sub-pixel comprising a second emissive region, the second emissive region configured to emit yellow light;
    a third sub-pixel comprising a third emissive region, the third emissive region configured to emit yellow light, the third sub-pixel configured to emit red light; and
    a fourth sub-pixel comprising a fourth emissive region configured to emit yellow light, the fourth sub-pixel configured to emit green light;
    wherein the pixel arrangement comprises emissive regions of not more than two colors, and the pixel arrangement comprises not more than two color altering layers.

24. The arrangement of claim 23, further comprising:
    a first color altering layer disposed in a stack with the third emissive region or the fourth emissive region.

25. The arrangement of claim 24, wherein the first color altering layer comprises a band-pass filter.

26. The arrangement of claim 24, wherein the first color altering layer comprises a cut-off filter.

27. The arrangement of claim 24, wherein the first color altering layer converts light emitted by the third emissive region to red light, or converts light emitted by the fourth emissive region to green light.

28. The arrangement of claim 27, wherein the second sub-pixel is unfiltered.

29. The arrangement of claim 27, further comprising:
    a fifth sub-pixel comprising a fifth emissive region configured to emit blue light; and
    a second color altering layer disposed in a stack with the fifth emissive region, the second color altering layer configured to convert light emitted by the fifth emissive region to deep blue light.

30. The arrangement of claim 23, wherein the yellow light emitted by the second sub-pixel has CIE coordinates that are not on the RG line on the 1931 CIE diagram.

31. A full-color pixel arrangement for an OLED device comprising:
    a first sub-pixel comprising a first emissive region configured to emit a first color;
    a second sub-pixel comprising a second emissive region configured to emit a second color;
    a third sub-pixel comprising a third emissive region configured to emit the second color;
    a fourth sub-pixel comprising a fourth emissive region configured to emit the first color or the second color;
    a first color altering layer disposed in a stack with the second emissive region; and
    a second color altering layer disposed in a stack with the third emissive region;: :
    wherein the first, second, third, and fourth sub-pixels together comprise emissive regions of not more than two colors, and the pixel arrangement comprises not more than two color altering layers.

* * * * *